United States Patent [19]

Cross

[11] 4,437,541

[45] Mar. 20, 1984

[54] CONTROLLED DISPERSION SPEAKER CONFIGURATION

[76] Inventor: Skip D. L. Cross, P.O. Box 2410, Alexandria, Va.

[21] Appl. No.: 373,101

[22] Filed: Apr. 29, 1982

[51] Int. Cl.[3] .............................................. H05K 5/00

[52] U.S. Cl. ..................................... 181/151; 181/199

[58] Field of Search ............... 181/145, 146, 150, 151, 181/199

[56] References Cited

U.S. PATENT DOCUMENTS 3,160,225 12/1964 Sechrist .............................. 181/151

*Primary Examiner*—Benjamin R. Fuller

*Attorney, Agent, or Firm*—Wigman & Cohen

[57] ABSTRACT

A controlled dispersion loudspeaker configuration is disclosed in which a loudspeaker is mounted through a hole in a front baffle forming a seal between the speaker and the baffle. A rear baffle is parallely spaced a predetermined distance away from the front baffle by means of spacers. Acoustically absorptive material is placed between the two baffles and is acoustically open on at least two opposite sides. The sound waves from the rear of the speaker exit from the acoustic material and serve to cancel the sound waves at the sides and rear of the loudspeaker configuration eminating from the front of the speaker. The size of the baffles, as well as the spacing therebetween, bears a particular relationship to the frequency of the sound to be reproduced by the loudspeaker.

6 Claims, 9 Drawing Figures

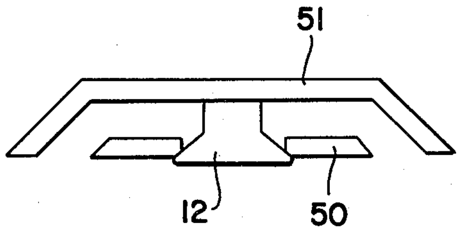
FIG. 3A
FIG. 3B
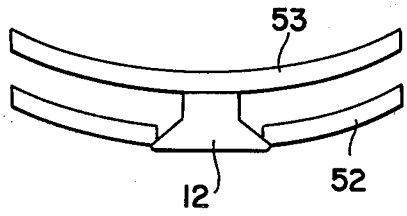
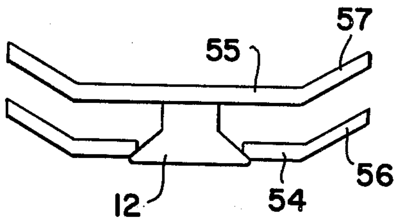
FIG. 3C

CONTROLLED DISPERSION SPEAKER CONFIGURATION

BACKGROUND OF THE INVENTION

The present invention relates to loudspeaker systems and, more particularly, to a new and improved loudspeaker configuration having a predetermined constant forward directional characteristic over a wide audio frequency range.

In sound reproduction applications such as auditorium speaker systems, public address systems, and home audio systems; it is desirable to provide sound radiation patterns which have front directional characteristics and have little or no acoustical radiation to the sides and rear. This is because sideward and rearward acoustical radiations cause reflection and reverberation effects which interfere with the intelligibility of sound. Additionally, such sideward and rearward radiations often result in acoustical feedback to a microphone which causes an oscillatory condition with audible howling or squealing noises.

Within an enclosed listening area sound reproduction consists of both direct and reflected acoustical radiations. Direct radiation is that portion of the sound waves which is reproduced by a speaker system and travels in a straight line to the listener. The direct sound radiation contains all of the original information as it was created. In the case of recordings this information provides the depth, clarity and the location of instruments and vocalists, as well as the reverberation effects of the original recording environment. Interference with this direct sound radiation distorts and impedes accurate sound reproduction for the listener.

Reflected acoustical radiation is caused by sound waves striking against obstacles such as floors, ceilings, walls, and furnishings. The sound waves then bounce back to both the listener and the direct sound waves radiated from the speaker system. The reflected sound creates interference with the direct acoustical radiation bv adding to or subtracting from the intensity of the direct sound waves and by causing reverberation effects. Reverberation, better known as echo, results from multiple reflections at successively decreasing intensities which persist after the original sound has stopped. These interference effects are more pronounced when the listening room is small or obstacles are close to the speaker system. In stereo reproduction these interference effects cause a scattering of the sound image which should exist between the two speaker systems. Superimposing the acoustical properties and reverberations of the listening area on the original sound is undesirable for accurate sound reproduction. Thus, by eliminating sideward and rearward acoustical radiation patterns and creating frontal dispersion characteristics, reflected sound can be reduced to negligible levels.

Sound radiation patterns from any individual speaker unit are wide and approach omnidirectional at lower frequencies where the wavelengths are large compared to the size of the speaker diaphragm. In contrast, at higher frequencies, where wavelengths are small compared to the speaker diaphragm, the sound radiation patterns become narrow and start to beam.

To create sound, a speaker diaphragm vibrates in response to an inputted electrical signal. When moving forward the speaker diaphragm causes a compression of air to occur to the front and a simultaneous rarefaction to occur to the rear of the diaphragm. The waves of alternating compression and rarefaction are 180 degrees out of phase with each other and, if allowed to meet, would cancel each other causing a void or null area. When the air is compressed on one side of the diaphragm, the air from that side rushes to the decompressed side in an attempt to equalize pressures, thus cancelling the sound waves emanating from the opposite side.

At higher frequencies the same speaker unit is very directional and radiates a narrow beam of sound to the front and the rear at equal intensity. Since the speaker diaphragm is moving at a very high rate, the wavelengths are short in relation to the diaphragm, and the air does not have time to travel from one side to the other; therefore, little effect from cancellation is noted.

As the frequency decreases, the radiation pattern broadens, and the out-of-phase sound waves meet at the edges of the speaker unit and begin to cancel. At even lower frequencies, the diaphragm is moving at a slower rate, and the wavelengths are large in relation to the diaphragm. The air then has time to travel around the edges of the speaker unit to the other side and causes almost total cancellation of the front and rear sound waves.

By extending the edges of the speaker or mounting the speaker in a baffle such that the front and rear remain open, the sound path length from front to rear is made longer, thereby lowering the frequency at which the cancellation effects occur. This configuration is known as a dipole which, due to the sound cancellation to the sides of the baffle and the continued acoustic radiation to the front and rear of the baffles, results in a cosine or figure-8 dispersion pattern. As the audio frequency varies from high to low, the front radiation pattern changes from narrow, to wide, and back to narrow, prior to cancellation. This provides a limited frequency range, or bandwidth, at which the dispersion pattern remains somewhat more constant. The shape of the front dispersion pattern, however, is affected not only by the radiating frequency, the size of the baffle, and the size of the speaker diaphragm, but also by the proximity of obstacles and room boundaries such as a wall located to the rear of the dipole speaker.

On the other hand, by enclosing the speaker unit completely so that only the front is exposed, no rear sound wave radiation is allowed to meet and cancel the front sound wave radiation. In this configuration, however, the frontal dispersion pattern again varies extensively in relationship with the frequency and the size of the speaker diaphragm. Since the enclosure behaves as a very small room affixed to the rear of the speaker unit, internal reflections are generated that cause resonances and exert pressures upon the rear of the speaker diaphragm which, in turn, produce variations in the output sound intensity. Further, the speaker diaphragm movement is restricted by the air trapped within the enclosure. This restriction impacts upon the transient response of the speaker system by limiting the ability of the speaker diaphragm to move quickly in response to an electrical pulse. Additionally, a new form of interference called diffraction results from a box-like enclosure with abrupt edges. Diffraction causes a modulation at the edges which redistributes the sound energy outwardly and back upon the original sound waves.

In the prior art, to provide a more stable radiation or dispersion pattern, it is conventional in speaker systems to divide the audio frequency range between multiple speaker units mounted in a common enclosure. A large bass unit, or "woofer", is used for reproducing the lower frequencies. A smaller speaker unit is used for the mid-range frequencies. A still smaller treble unit, or "tweeter", is used for the higher frequencies. However, multiple unit speaker systems are employed for more than just dispersion pattern considerations such as power handling capabilities, frequency response characteristics, and distortion values.

At the higher audio frequency ranges directivity is not too difficult to achieve by virtue of the diaphragm size and possible horn-shaped speaker units which project the sound forward. In the upper middle frequencies and down to the bass frequencies the dispersion pattern can very greatly within a speaker system depending upon the number of speaker units, their size and shape, and the frequency range assigned to each speaker unit. Most techniques used in the prior art for attaining directivity at these frequencies have involved arrays of speaker units, single speaker units with very large radiating diaphragms, or extremely large horn units.

In order to reduce or control reflections and reverberation effects the prior art has employed special construction procedures for the listening areas. These construction techniques involve the use of special room dimension ratios, non-parallel walls and ceilings, and acoustically absorptive materials on reflective surfaces. Other prior art techniques incorporate electronic devices, such as graphic and parametric equalizers, to compensate for frequency intensity variations within a very limited portion of the listening area.

One approach to solving the problem of reflection and reverberation effects is disclosed by U.S. Pat. No. 3,722,616, to Beavers. In that patent a bass loudspeaker is mounted in an enclosure having a front port through which the frontal sound waves emanate and open side or rear ports through which the rear sound waves radiated by the speaker cone exit. Beavers' loudspeaker system is designed to provide cancellation of the sound radiated to the rear of the loudspeaker such that most of the acoustic radiation is in the forward direction. Beavers additionally requires an enclosure volume with acoustical compliance in conjunction with resistive material covering the ports to provide a time delay. It should be stressed that any enclosure having both volume and ports will have a point of resonance described by the Helmholtz resonator effects. This technique is widely used in bass-reflex speaker systems because at and near resonance the ports generate sound radiation which is approximately in-phase with the front radiation, hence, adds to the total bass output. Whereas above resonance, the speaker system behaves as a sealed enclosure with little or no output from the ports. These actions are counterproductive to solving the problem of reflection and reverberation effects.

SUMMARY AND OBJECTS OF THE INVENTION

In view of the foregoing, it should be apparent that there still exists a need in the art for a loudspeaker arrangement which provides a controlled dispersion acoustic energy dispersion pattern in a simple and precise manner. It is therefore a primary object of this invention to provide a loudspeaker arrangement which provides a controlled dispersion acoustical sound pattern which has a particular application for both commercial and home audio systems.

More particularly, it is an object of this invention to provide a controlled dispersion audio loudspeaker arrangement which is simply and reliably constructed and does not require costly electronic components.

Still more particularly, it is an object of this invention to provide a controlled dispersion audio loudspeaker arrangement which uses the rear sound waves generated by the loudspeaker to control and shape the front waves to prevent baffle edge diffraction effects.

Another object of the present invention is to provide a controlled dispersion loudspeaker arrangement which produces a cardiod-shaped front dispersion pattern which minimizes the impact of the placement of the loudspeaker arrangement and yields accurate sound reproduction within a listening room.

A further object of the present invention is to provide a controlled dispersion louspeaker arrangement in order to produce a stable sound image.

A still further object of the present invention is to provide a controlled dispersion loudspeaker arrangement which minimizes the effect of sideward and rearward sound radiations in order to reduce both reverberation and audio feedback problems.

Another object of the present invention is to provide a controlled dispersion loudspeaker arrangement which provides consistently accurate audio frequency sound reproduction regardless of its placement and independent of the boundaries, dimensions, shape, or reflective characteristics of a listening room.

Still another object of the present invention is to provide a controlled dispersion loudspeaker arrangement which routes and uses the rear radiation from a speaker diaphragm to control and shape the front sound radiations to sustain a more constant and predetermined dispersion pattern over a wide and extended audio frequency range.

Briefly described, these and other objects of the invention are accomplished by a loudspeaker arrangement having two essentially vertical planar and parallel baffles which are spaced one behind the other, the forward baffle having one or more speaker units mounted in a conventional manner for radiating sound from the front of a speaker diaphragm. The space between the forward and rear baffles forms a channel for routing the sound which is radiated from the rear of a speaker diaphragm. This sound is out-of-phase with the front sound radiation. The channel between the two baffles is partially filled with acoustically absorptive material so as to vary the intensity of the sound emanating from the sides in relation to the reproduced frequency. The shape and dimensions of the baffles, the amount and density of the acoustically absorptive material, and the spacing between the baffles are chosen so that the rear sound which is radiated and routed to the sides of the loudspeaker arrangement effectively cancels the sound arriving from the front of the speaker diaphragm at the side locations of the loudspeaker arrangement. The rear sound radiation is routed and used to control and shape the front sound radiation, thus sustaining a more constant dispersion pattern over a wide audio frequency range. This configuration minimizes the effects of side and rear sound radiations and produces a stable forward directional dispersion pattern.

BRIEF DESCRIPTION OF THE DRAWINGS

FIGS. 3A–3C are top views of alternate baffle constructions which may be used with the present invention;

DETAILED DESCRIPTION OF THE PREFERRED EMBODIMENT

The speaker configuration of the present invention comprises two approximately vertical, planar and spaced apart baffles with one baffle behind the other. They are attached together in parallel. A loudspeaker unit is mounted through the front baffle so that rear sound radiations are channeled between the two baffles and routed to the open sides. The front sound radiations emanate from the speaker unit in a conventional manner. A predetermined amount of acoustically absorptive material is used between the baffles to control the intensity of the rear out-of-phase radiations which are routed to the sides of the speaker configuration.

The characteristics of well-known acoustically absorptive material, such as fiberglass, are both resistive and inductive. The material thus behaves as a low pass filter. That is, higher frequencies passing through it are absorbed while lower frequencies are passed with less attenuation. Given the directional characteristics of a speaker unit which are narrower at higher frequencies and approach omnidirectional at lower frequencies, the objective of a more constant frontal dispersion pattern can be achieved by routing the rear out-of-phase radiations to the sides through acoustically absorptive material. At higher frequencies, where no cancellation effects are desired, the out-of-phase sideward radiations are absorbed. At lower frequencies, where more cancellation is necessary to reshape the front radiations into a more directional dispersion pattern, more out-of-phase sideward radiations are allowed to pass to create this cancellation. This cancellation, or null, at the sides, counteracts the edge diffraction effects and diminishes rearward and sideward radiations. The design requirements of a controlled dispersion speaker configuration are satisfied by adjusting the spacing between the two baffles, the amount and density of the acoustically absorptive material, the size and shape of the baffles, and the audio frequency bandwidth assigned to the speaker units.

To prevent internal reflections and resonances, the spacing between the baffles is kept to less than one-fourth the wavelength of the highest frequency assigned to the speaker unit mounted therein. In general, the size of each baffle is chosen such that the width and height are not less than one-sixth nor larger than three-fourths the wavelength of the lowest frequency assigned to the speaker unit. The surface of the baffles may be flat or curved, and the shape of the baffles may be circular, oval, square or rectangular depending upon the design criteria and aesthetic appeal desired. The sound path lengths from the front and rear of the speaker diaphragm to the sides should be nearly equal so as to maintain the out-of-phase relationship which is used to control the frontal dispersion pattern.

Figure 1:
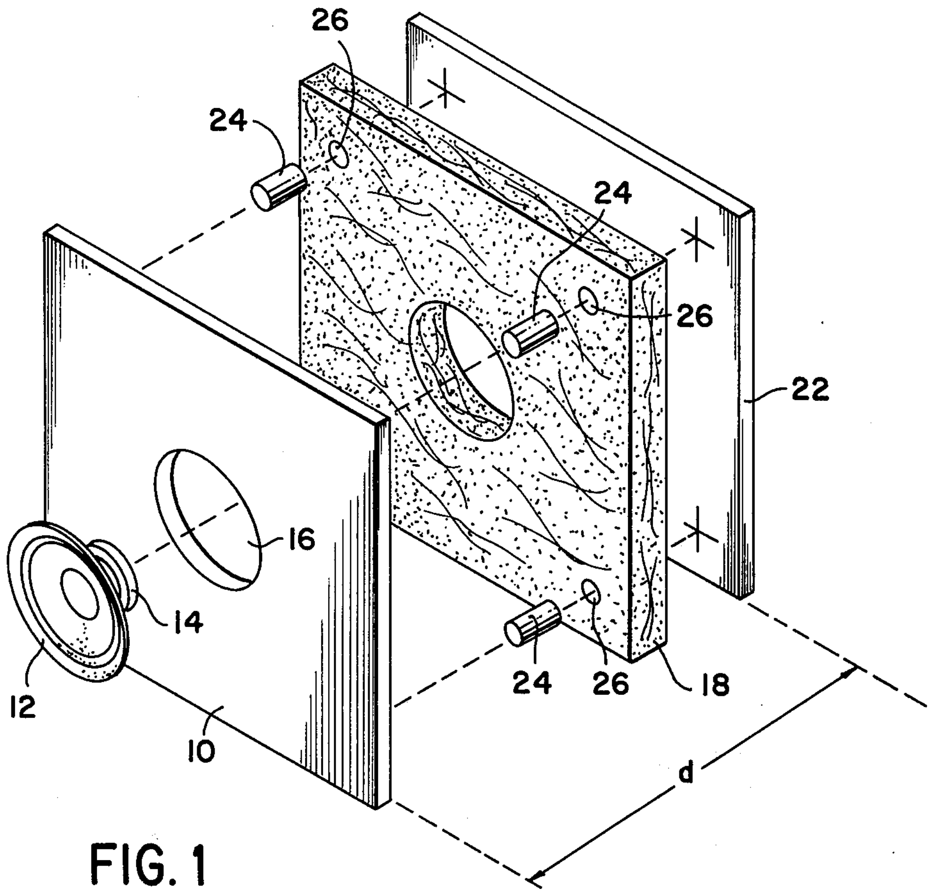
FIG. 1 is an exploded perspective diagram showing one embodiment of the present invention.
Figure 2:
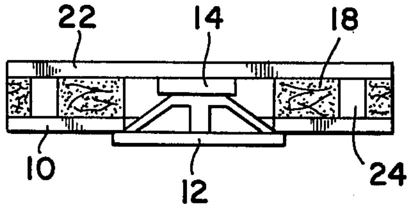
FIG. 2 is a top view of the embodiment of the invention of FIG. 1.

Referring now in detail to the drawings wherein like parts are designated by like reference numerals throughout, there is illustrated in FIGS. 1 and 2 a preferred embodiment of the controlled dispersion loudspeaker configuration of the present invention. A substantially planar front baffle 10 forms the front of the speaker enclosure while a rear baffle 22, of similar shape, size and material, forms the rear of the enclosure. The material from which the baffles 10 and 22 are made should be one which is non-resonant. Additional sound deadening material, such as spray undercoating commonly used with automobiles, may also be applied to the inwardly facing surfaces of the baffles 10 and 22.

The front baffle 10 has a hole 16, preferably located in the center of the baffle 10, through which the majority of the speaker 12 is passed in order to secure the speaker 12 to the front baffle 10. The speaker 12 is of conventional design and has a magnet 14 at the rear of its speaker cone. The speaker 12 is mounted to the front baffle 10 by conventional means such that its magnet 14 projects rearwardly toward the inside surface of the rear baffle 22.

The rear baffle 22 is attached to the front baffle 10 by means of spacers 24, which may be, for instance, dowels. The spacers may be secured to the baffles by any convenient means, such as glue, screws, etc. The inner surface of the rear baffle 22 is thus maintained in a position parallel to the inner surface of the front baffle 10 and spaced a predetermined distance away therefrom. This distance d should be less than one-quarter of the wavelength of the highest frequency that the speaker 12 is expected to produce. The width and height of each baffle 10 and 22 should be between one-sixth and three-fourths of the wavelength of the lowest frequency that the speaker 12 is expected to reproduce.

An acoustically absorptive material 18 is secured between the front and rear baffles 10 and 22 by means of holes 26 through which the spacers 24 pass. Obviously, if four such spacers are used, four holes 26 are required. The absorptive material 18 is of the same length and width as the front and rear baffles 10 and 22 and, like the front baffle 10, has a hole 20 so that the magnet 14 and cone structure and support of the speaker 12 can pass through.

As shown in FIG. 2, the magnet structure of the speaker 14 should ideally be in contact with the inner surface of the rear baffle 22. Since the outside rim of the speaker is sealed against the outer surface of the front baffle 10, all of the sound waves produced at the rear of the speaker 12 are channeled outwardly through the absorptive material 18, while all of the sound waves produced at the front of the speaker are directed outwardly away from the front of the speaker enclosure. While the embodiment shown has all four sides of the speaker enclosure open through the absorptive material 18, it is only necessary to have two opposing complete sides acoustically open for the invention to function as described herein. If the complete sides (or top and bottom) are not open, the openings will behave similar to ports which would produce undesirable delay of the rearward signals and Helmholtz resonator effects.

The rearwardly produced waves eminating from the rear of the speaker 12 are both attenuated and low pass filtered by the absorptive material 18. Typically, enough absorptive material 18 should be used to attenuate the average power produced by the speaker over the entire reproductive bandwidth between 60 and 90 degrees off-axis of the center of the speaker 12.

FIGS. 3A–3C show various alternate embodiments in which the front baffles and rear baffles are spaced the same predetermined distance d apart and are parallel to each other, but are not necessarily parallel to a plane passing through the cone of the speaker 12 from side to side. Thus, for instance, FIG. 3A shows a rear baffle 51 which is parallel to all of the inner surface of the front baffle 50, but which is U-shaped and wraps around the speaker and front baffle 50.

FIG. 3B shows two baffles 52 and 53, which are parallel to each other, but which are curved in relation to a plane passing through the cone of the speaker 12. Obviously, the baffles may be curved either inwardly or outwardly.

FIG. 3C shows two baffles 54 and 55, which are constructed parallel to each other. However, the end portions 56 and 57 of each of the front and rear baffles 54 and 55 are constructed at some angle between 0° and 90° to the planar portion of the baffles 54 and 55. In the embodiment shown, the side portions of the baffles 56 and 57 are angled away from the front of the speaker 12, however, these portions 56 and 57 could also be angled towards the front of the speaker 12.

Figure 4A:
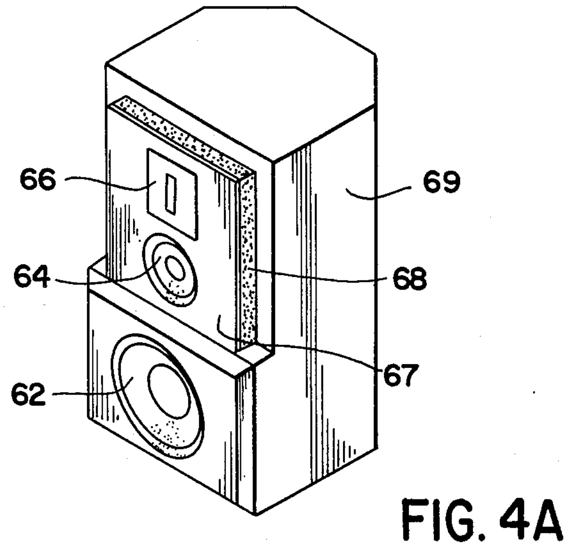
FIGS. 4A–4B are perspective views of two different multi-speaker systems utilizing the controlled dispersion speaker of the present invention.
Figure 4B:
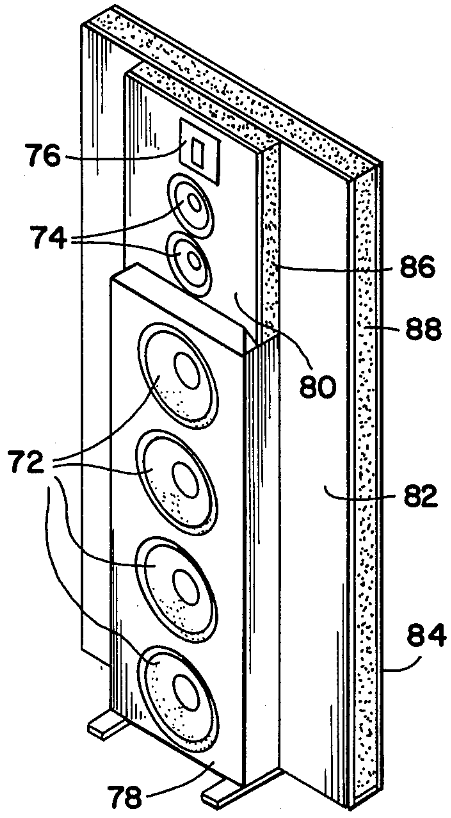

FIGS. 4A and 4B both show multi-speaker configurations using the controlled dispersion loudspeaker of the present invention. FIG. 4A shows a three-way speaker system 60 having a conventional woofer or bass speaker 62, midrange speaker 64 constructed in the manner of the disclosed controlled dispersion design and a high frequency speaker or tweeter 66, also of conventional design. The three speakers 62, 64 and 66 are connected to a suitable crossover network. The midrange speaker 64 is mounted as described in FIG. 1, except that the absorptive material 68 is open only on three sides, instead of all four. However, the absorptive material may also be open on only two sides. The speakers 64 and 66 may be mounted by means of the baffle 67 to a conventional speaker enclosure 69.

FIG. 4B shows another multi-speaker configuration 70 using the disclosed controlled dispersion speaker configuration. Thus each of the bass speakers 72 is mounted in a bass speaker baffle 78 in the same manner as described in FIG. 1. The midrange speakers 74 and tweeter 76 are mounted to a midrange speaker baffle 80 which baffle 80 extends downward only as far as the bass speaker baffle 78. Absorptive material 86 is interposed between the baffle 80 and a first rear baffle 82, which serves as the rear baffle for the midrange speakers 74 in a manner as described in FIG. 1. A second rear baffle 84 is arranged parallel to the first rear baffle 82 and absorptive material 88 is sandwiched between these two rear baffles 82 and 84. This rear baffle 84 serves as the rear baffle for bass speakers 72. It is also parallel to the baffles 78, 80 and 82. The sound waves from the bass speakers 72 thus exit the speaker system 70 through the absorptive material 88, while the sound waves from the midrange speakers 74 exit from the absorptive material 86. The speaker system 70 may be configured such that at least two opposing sides of the absorptive material 86 and 88 are acoustically open. As with loudspeaker system 60, suitable cross-over networks are employed in order to select specific frequency ranges to be reproduced by each of the speakers.

Figure 5:
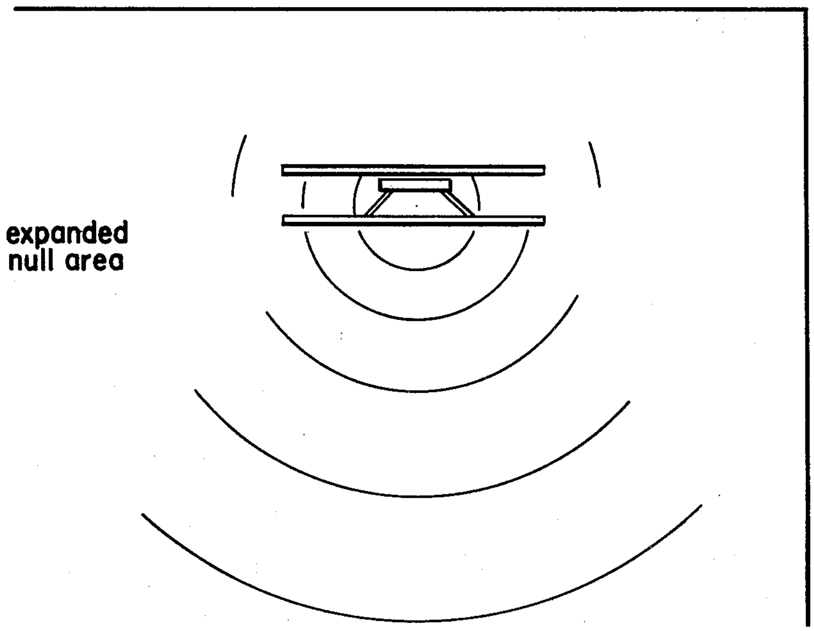
FIG. 5 is a diagram showing the sound wave pattern created by the speaker configuration of the present invention.

The controlled dispersion loudspeaker configuration of the present invention has been found to yield the best results when operated within a frequency range of 70 Hz to 6 KHz. This is probably due to the fact that, at higher frequencies, the sound waves from the drivers become less dispersed and thus, there is little need to control the dispersion. Below approximately 70 Hz, nearby room boundaries couple with the speaker system and act as extensions of the speaker baffle surface thereby reducing reflections and reverberation effects FIG. 5 shows the sound wave radiation pattern created by the disclosed controlled dispersion loudspeaker system, as described above.

Figure 6:
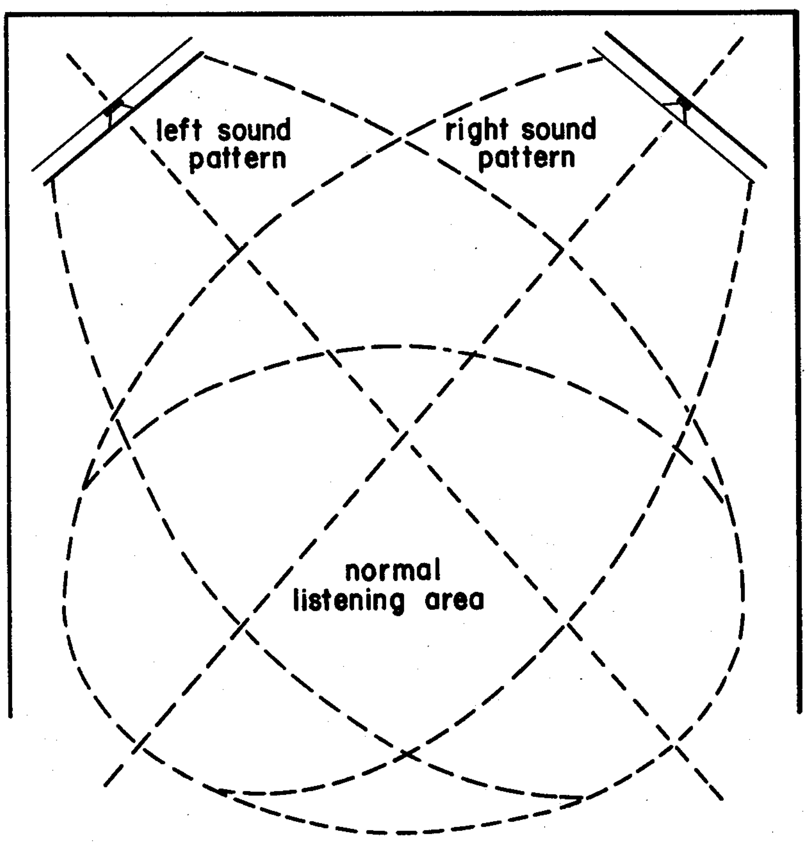
FIG. 6 is a diagram showing the sound wave pattern created by a pair of speaker configurations of the present invention, operated in a stereo configuration.

FIG. 6 shows the cardiod-shaped sound wave patterns created by a stereo configuration of two controlled dispersion speakers of the present invention and the resulting listening sound pattern.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. A speaker comprising:

an enclosure formed by first and second parallel, spaced-apart, planar baffles, said enclosure being acoustically open on at least two sides;

first speaker means mounted to said first baffle;

acoustically absorptive material secured between said first and second baffles; and the spacing between said first and second spaced-apart baffles is less than one-fourth of the wavelength of the highest frequency to be reproduced by said speaker system.

2. A speaker system comprising:

an enclosure formed by first and second parallel, spaced-apart planar baffles, said enclosure being acoustically open on at least two sides;

first speaker means mounted to said first baffle such that front sound waves are radiated from the front of said speaker, outwardly from said first baffle and rear sound waves are radiated from the rear of said speaker, rearwardly towards said second baffle;

said rear sound waves being 180° out-of-phase with said front sound waves;

acoustically absorptive material mounted between said first and second baffles to selectively attenuate said out-of-phase rear sound waves; and said first and second baffles are configured such that the distance therebetween is less than one-fourth of the wavelength of the maximum frequency contemplated to be reproduced by said speaker system.

3. A controlled dispersion speaker system, comprising:

an enclosure formed by first and second vertical and planar spaced-apart baffles secured in parallel configuration one to the other, said enclosure being acoustically open on at least two sides;

first speaker means having a diaphragm with front and rear portions for radiating sound waves in opposite phase relation, mounted to said front baffle for radiating sound waves outwardly from said first baffle from the front portion of the diaphragm;

the space formed between said first and second spaced-apart baffles forming a channel for routing the out-of-phase sound waves produced by said diaphragm rear portion to the edge of said first and second baffles;

acoustically absorptive material partially filling said channel for controlling the intensity of the out-of-phase sound waves radiated by said diaphragm rear portions; and said channel has a width of less than one-fourth of the wavelength of the maximum frequency to be reproduced by said speaker system, whereby said speaker system operates to control and shape the front sound waves to a predetermined desired configuration and to reduce acoustical energy present at the sides and rear of said speaker system.

4. The speaker system of claims 1, 2 or 3, wherein the width and height of said first and second baffles is greater than one-sixth and less than three-fourths of the wavelength of the lowest frequency contemplated to be reproduced by said speaker system.

5. The speaker system of claims 1, 2 or 3, further including at least one additional speaker means similarly mounted to said speaker system and operating within the same frequency range of said first speaker means.

6. The speaker system of claims 1, 2 or 3, further including at least one additional speaker means similarly mounted to said speaker system and configured to divide the frequencies to be reproduced with said first speaker means.

* * * * *